US007106809B2

(12) United States Patent
Whikehart et al.

(10) Patent No.: US 7,106,809 B2
(45) Date of Patent: Sep. 12, 2006

(54) AM/FM/IBOC RECEIVER ARCHITECTURE

(75) Inventors: J. William Whikehart, Novi, MI (US); John Elliot Whitecar, Plymouth, MI (US); Darby Edward Hadley, Westboro, MA (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 873 days.

(21) Appl. No.: 09/862,043

(22) Filed: May 21, 2001

(65) Prior Publication Data

US 2002/0172270 A1 Nov. 21, 2002

(51) Int. Cl.

*H03K 9/00* (2006.01)
*H04L 27/06* (2006.01)
*H04L 27/14* (2006.01)
*H04L 27/22* (2006.01)

(52) U.S. Cl. ...................... 375/316; 375/270; 375/298; 381/2; 381/3; 455/131

(58) Field of Classification Search ................ 375/340, 375/270, 298, 316; 455/12.1, 131, 313, 314, 455/323, 334; 381/2-3, 77, 119
See application file for complete search history.

(56) References Cited

U.S. PATENT DOCUMENTS 4,893,316 A 1/1990 Janc et al. .................... 375/44
5,146,507 A 9/1992 Satoh et al. ................ 381/103
5,490,173 A 2/1996 Whikehart et al. ......... 375/316
5,732,337 A * 3/1998 Wargnier et al. ........... 455/144
5,850,415 A 12/1998 Hunsinger et al.
5,878,089 A 3/1999 Dapper et al.

(Continued)

OTHER PUBLICATIONS

*IBOC Proponents Face Final Hurdle in Quest for CD-Quality Broadcasts*, Electronic Design, Aug. 23, 1999 vol. 47, No. 17 <http://www.planetee.com/servlet/DisplayDocument?ArticleID=3356>.

(Continued)

*Primary Examiner*—Khanh Tran
*Assistant Examiner*—Curtis Odom
(74) *Attorney, Agent, or Firm*—Brinks Hofer Gilson & Lione

(57) ABSTRACT

An RF receiver operates to receive broadcast RF signals that include at least one of an analog portion and a digital portion. The RF receiver performs processing of the analog portion and/or the digital portion to generate a digital path signal. The RF receiver performs further processing of the analog portion to generate a first audio signal. A digital modulation processing system may be electrically connected with the RF receiver. The digital modulation processing system may receive and process the digital path signal to generate a second audio signal. The RF receiver may selectively utilize at least one of the first audio signal and the second audio signal to generate an audio output.

57 Claims, 4 Drawing Sheets

U.S. PATENT DOCUMENTS

| | | | | |
|---|---|---|---|---|
| 5,956,373 | A * | 9/1999 | Goldston et al. | 375/298 |
| 5,983,087 | A | 11/1999 | Milne et al. | 455/149 |
| 6,005,894 | A * | 12/1999 | Kumar | 375/270 |
| 6,114,774 | A | 9/2000 | Fiegura | 307/9.1 |
| 6,128,334 | A | 10/2000 | Dapper et al. | |
| 6,167,246 | A | 12/2000 | Elder et al. | |
| 6,178,317 | B1 | 1/2001 | Kroeger et al. | |
| 6,256,358 | B1 | 7/2001 | Whikehart et al. | 375/316 |
| 6,590,944 | B1 * | 7/2003 | Kroeger | 375/340 |
| 2002/0106987 | A1 * | 8/2002 | Linden | 455/12.1 |

OTHER PUBLICATIONS

*Visteon and iBiquty form strategic alliance to develop AM and FM Digital Radios*, iBiquity Digital Corporation, <http://www.ibiquity.com/news/news_visteon.html>.

*USA Digital Radio Takes Vegas by Storm*, RadioWorld, May 17, 1995 vol. 19, No. 10.

* cited by examiner

AM/FM/IBOC RECEIVER ARCHITECTURE

BACKGROUND

1. Field of the Invention

This invention relates to receipt of RF frequency broadcasts, and more particularly to a receiving system capable of receiving and processing analog audio broadcasts as well as digital audio broadcasts (DAB).

2. Description of the Related Art

Recently, digital audio broadcasting (DAB) systems have been developed capable of providing digital signals broadcast on existing AM (amplitude modulation) and FM (frequency modulation) spectrum allocations. The ability to broadcast on these radio frequencies uses In Band On Channel (IBOC) technology. In general, IBOC provides the ability to transmit a broadcast on a radio frequency (RF) carrier with conventional AM or FM modulation (e.g. analog modulation) as well as digital modulation centered on the same RF carrier. As such, an RF signal generated with IBOC consists of an analog portion and a digital portion of the modulation sharing the same RF carrier frequency.

Since IBOC signals are sent on standard RF carrier frequencies, the signals may be received by a conventional AM and/or FM radio receiver. However, conventional AM and/or FM radio receivers process only the analog portion of the IBOC signal. To achieve the increased sound quality available from the digital portion of the RF signal, the radio receiver must include additional processing capability.

Radio receivers capable of processing both the analog and the digital portions of the RF signal may perform the processing in the analog domain, the digital domain or some combination thereof. These receivers include circuitry exclusively for processing the analog portion and parallel circuitry exclusively for processing the digital portion. This redundant functionality for independently processing the analog portion and the digital portion may increase the complexity of the receiver. The increased complexity may result in increased manufacturing and hardware costs as well as requirements for a larger space to accommodate such a receiver.

BRIEF SUMMARY

The present invention is defined by the following claims, and nothing in this section should be taken as a limitation on those claims. By way of introduction, the embodiments described below include a system and method for processing a radio frequency (RF) signal that includes conventional AM/FM analog modulation (e.g. an analog portion) and/or digital modulation (e.g. a digital portion). The system is a versatile and cost effective solution that may be implemented in radio receivers designed to receive only conventional AM and/or FM modulation as well as those for receiving both conventional analog modulation and digital modulation. Versatility and cost effectiveness is achieved through minimized redundancy and decreased complexity.

Processing is performed by a receiver system that includes an RF receiver and may also include a digital modulation processing system. The RF receiver receives and processes the RF signal using techniques similar to conventional techniques for processing conventional AM/FM modulation. Initially, the RF receiver performs processing common to both the analog portion and the digital portion of the RF signal. Following common processing, the analog portion is further processed by the RF receiver to generate a first audio signal. Further processing of the digital portion may be performed by the digital modulation processing system to generate a second audio signal. The RF receiver then performs common processing of at least one of the first and second audio signals to generate an audio output.

Cooperative operation of the RF receiver and the digital modulation processing system occurs through interfaces between the RF receiver and the digital modulation processing system. Within the common processing, the analog portion and the digital portion of the RF signal are simultaneously processed by the same circuits. An interface is provided at a point in the common processing where signals compatible with inputs to the digital modulation processing system are present. The interface allows the transfer of a signal to the digital modulation processing system on a digital path, while at the same time providing the signal to the RF receiver on an analog path for further processing therein. Following individual processing on the analog path and the digital path to generate the first and second audio signals, respectively, another interface is provided between the RF receiver and the digital modulation processing system. This interface provides for receipt of the second audio signal by the RF receiver. The RF receiver may then perform common processing with at least one of the first audio signal and the second audio signal.

Through common processing of the analog and the digital portion of the RF signal, the receiving system minimizes redundancies. In addition, the processing techniques utilized in the RF receiver allow for highly efficient integration of the digital modulation processing system. In one application, the RF receiver may be used with the digital modulation processing system to process IBOC signals. In another application, the RF receiver may be used without the digital modulation processing system to process only conventional AM and/or FM signals. As such, the RF receiver is a versatile and cost effective solution with common application in IBOC and non-IBOC signal processing.

Further aspects and advantages of the invention are discussed below in conjunction with the preferred embodiments.

DETAILED DESCRIPTION OF THE PREFERRED EMBODIMENTS

The presently preferred embodiments provide a receiver system capable of processing radio frequency (RF) signals. The RF signals carry conventional AM or FM signals (an analog portion) and may also carry digital audio broadcast (DAB) signals (a digital portion). A portion of the processing within the receiver system is performed with the same circuitry for both the analog portion and the digital portion. Accordingly, redundant circuits and processing is minimized. The architecture of the receiver system is optimized to process the analog portion using techniques similar to conventional processing techniques with relatively minor additional processing required to support the digital portion. Accordingly, the receiver system may be configured to support both digital audio broadcast signals and conventional analog signals or only conventional analog signals without significant changes in operation or configuration.

Figure 1:
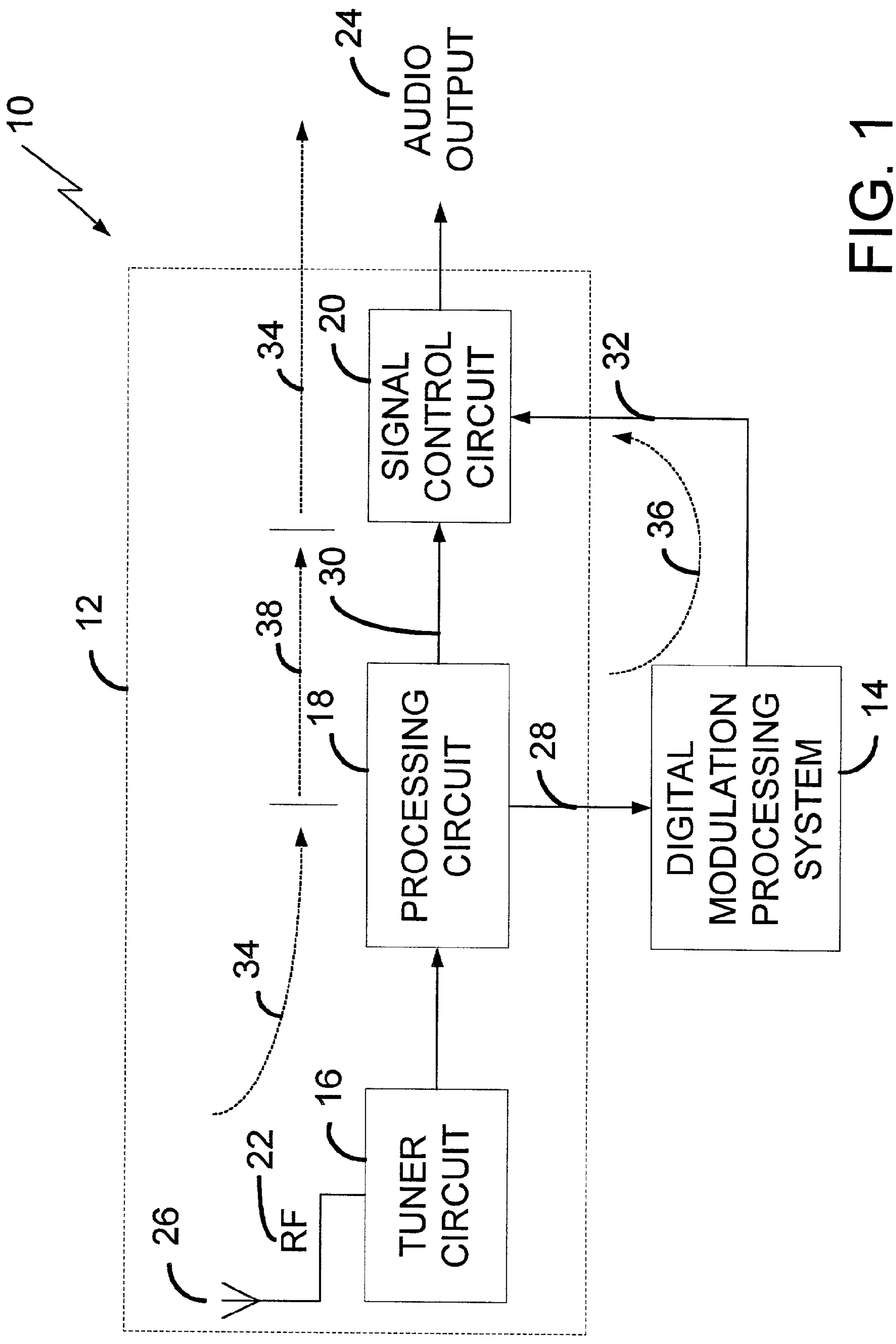
FIG. 1 is a block diagram of one embodiment of a receiver system.

FIG. 1 illustrates a block diagram of one embodiment of a receiver system 10 that includes a radio frequency (RF) receiver 12 and a digital modulation processing system 14. The radio frequency receiver 12 includes a tuner circuit 16, a processing circuit 18 and a signal control circuit 20 electrically connected as illustrated. The processing circuit 18 and the signal control circuit 20 may also be electrically connected with the digital modulation processing system 14.

The receiver system 10 receives and processes an RF signal 22 to produce an audio output 24. The audio output 24 is an analog electric signal that may be supplied to an amplifier and/or a transducer device, such as a conventional loud speaker, to convert the electric signal to sound waves. The RF signal 22 may be broadcast at radio frequencies, such as, for example, frequencies within the frequency modulation (FM) frequency band or the amplitude modulation (AM) frequency band.

The RF signal 22 may include analog modulation such as, for example, the modulation used for conventional FM signals or AM signals. In addition, or alternatively, the RF signal 22 may include digital modulation such as, for example, the modulation used for digital audio broadcast (DAB) signals. An RF signal 22 that includes both conventional analog signals and DAB signals is referred to as an in band on channel (IBOC) signal. "In Band" indicates that the DAB signal is transmitted in the same frequency band as the conventional analog signal. "On Channel" indicates that the DAB signal and the conventional analog signal share the same carrier frequency. Accordingly, an RF signal 22 may include an analog portion and/or a digital portion that are received and processed by the receiver system 10.

In the presently preferred embodiment, the receiver system 10 is part of an AM/FM radio. The receiver system 10 of this embodiment may be configured to produce the audio output 24 from the analog portion of the RF signal using the RF receiver 12. Alternatively, the receiver system 10 may be configured with the RF receiver 12 and the digital modulation processing system 14 to produce the audio output 24 with the analog portion, the digital portion or a combination of both. The RF receiver 12 of one embodiment is a fully integrated digital signal processor (DSP) based AM/FM receiver capable of cooperative operation with the digital modulation processing system 14. In other embodiments, the RF receiver 12 may not be fully integrated, or may be some combination of integrated and non-integrated circuits. The receiver system 10 of this embodiment receives RF signals with the tuner circuit 16.

The tuner circuit 16 may be any circuit or device capable of being set to a selected channel frequency within a frequency band. An exemplary tuner circuit 16 is the tuner circuit in a conventional AM/FM radio that allows selection of channel frequencies within the FM frequency band or the AM frequency band. The tuner circuit 16 includes an antenna 26 electrically connected as illustrated. The antenna 26 provides broadcast signals including the RF signal 22 to the tuner circuit 16. The tuner circuit 16 converts the RF signal 22 at the selected channel frequency to an analog signal referred to as an intermediate frequency (IF) signal in a well-known manner. The IF signal may be generated at some frequency other than the RF frequency such as, for example, 10.7 MHz for FM broadcasts or 450 kHz for AM broadcasts. The content of the IF signal includes the analog portion and the digital portion present in the RF signal 22. The IF signal is provided to the processing circuit 18.

The processing circuit 18 may be any circuit configuration capable of digitizing the IF signal and performing further processing to generate a digital path signal and a first audio signal. The first audio signal is a digital signal generated on a first audio signal line 30 by processing the analog portion of the IF signal. The digital path signal is generated as part of the processing to generate the first audio signal. The digital path signal includes both the analog portion and the digital portion of the IF signal and is made available to the digital modulation processing system 14 on the digital path signal line 28.

The digital modulation processing system 14 may be any circuit or device capable of processing to isolate and demodulate the digital portion of the digital path signal to produce a second audio signal. One embodiment of the digital modulation processing system 14 is an integrated circuit, or chip set, configured as a processor performing IBOC processing instructions. An exemplary developer of IBOC processing instructions is iBiquity Digital Corporation of Columbia, Md. The digital modulation processing system 14 receives the digital path signal and generates the corresponding second audio signal. The second audio signal is a digital signal provided to the signal control circuit 20 on a second audio signal line 32.

The signal control circuit 20 may be any circuit configuration capable of selectively using the first and second audio signals individually or in some combination to generate the audio output 24. In addition, the signal control circuit 20 may control parameters of the resulting sound waves through manipulation of the electric signal forming the audio output 24.

During operation, an RF signal 22 received by the receiver system 10 is converted to an IF signal by the tuner circuit 16. The IF signal is digitized by the processing circuit 18 to form the digital path signal made available to the digital modulation processing system 14. The processing circuit 18 and the digital modulation processing system 14 generate the first and second audio signals, respectively, from the respective analog and digital portions. At least one of the first and second audio signals is selectively used by the signal control circuit 20 to generate the audio output 24.

Processing of the RF signal 12 within the illustrated embodiment, can be categorized into processing occurring along a common path identified by arrows 34, along a digital path identified by arrow 36 and along an analog path identified by arrow 38. The common path represents processing of both the digital modulation and the analog modulation present in an IBOC signal. The digital path represents processing of the digital modulation, and the analog path represents processing of the analog modulation.

This embodiment of the RF receiver 12 generates the first audio signal using circuitry and processing techniques within the common path and the analog path that are similar to circuitry and techniques for processing conventional analog modulation. In addition, the RF receiver 12 uses the same circuitry and processing techniques within the common path to support the digital modulation processing system 14 in generation of the second audio signal. Further, the RF receiver 12 uses the same signal control circuit 20 within the common path to process at least one of the first and second audio signals and generate the audio output 24.

Execution of significant amounts of processing of both the analog and digital portions of the RF signal 22 with the common path of the RF receiver 12 minimizes redundancies. In addition, due to the elimination of redundant functionality and implementation of fully digital operation, the processing circuit 18 and signal control circuit 20 may be combined into a single digital signal processing (DSP) or application specific integrated circuit (IC). Finally, the receiver system 10 may operate using the analog portion, or both the analog and the digital portion, of the RF signal 22 thereby maximizing versatility.

Figure 2:
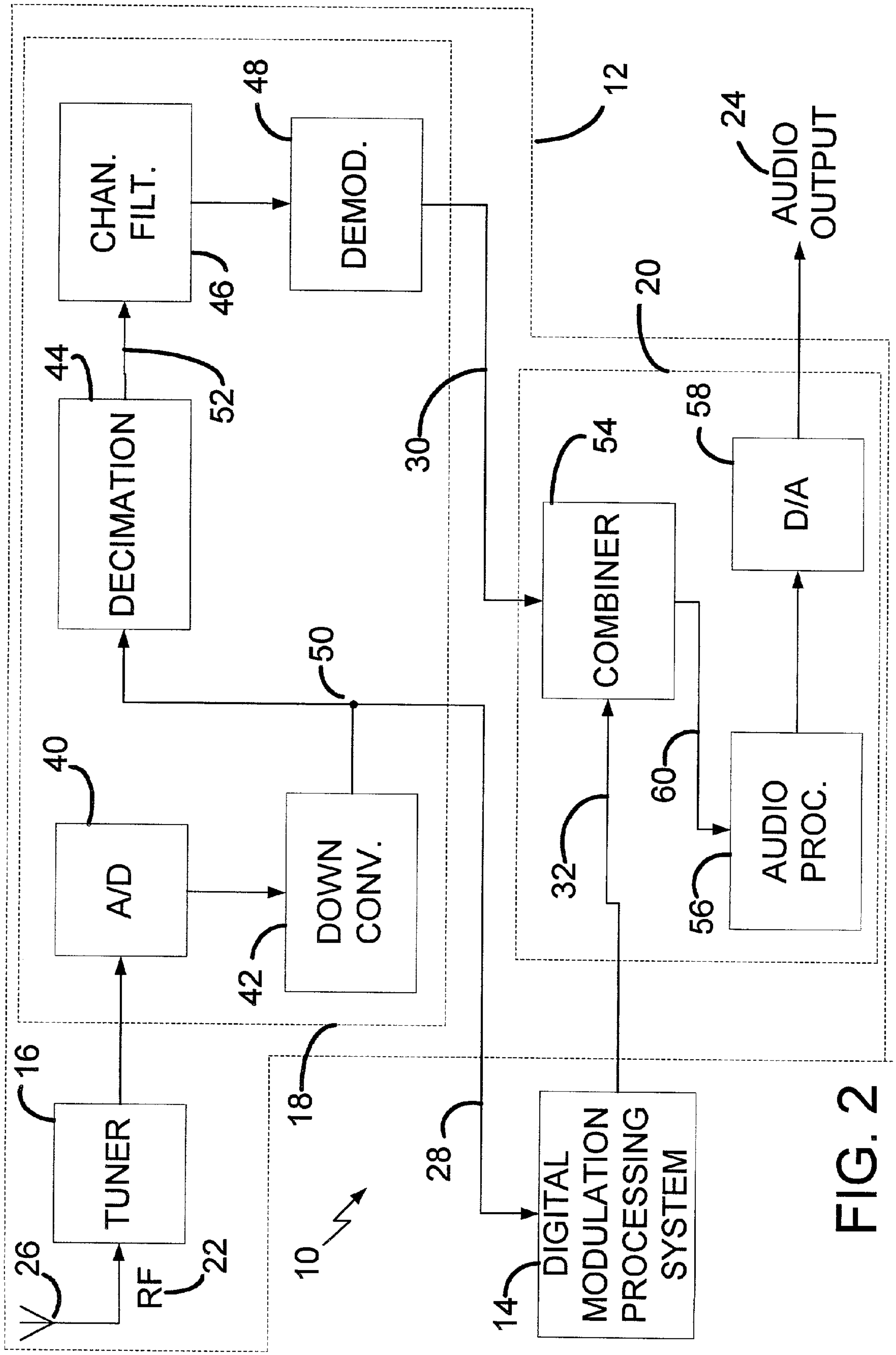
FIG. 2 is an expanded block diagram of one embodiment of the receiver system illustrated in FIG. 1.

FIG. 2 is an expanded block diagram of the receiver system 10 illustrated in FIG. 1 that includes the RF receiver 12 and the digital modulation processing system 14. The illustrated embodiment of the processing circuit 18 includes an analog-to-digital conversion (A/D) circuit 40, a digital down converter 42, a decimation circuit 44, a channel filter circuit 46 and a demodulator circuit 48 electrically connected as illustrated in FIG. 2.

The A/D circuit 40 is within the common path and may be any circuit capable of receiving and converting an analog signal to a digital signal. The analog signal received by the A/D circuit 40 of the illustrated embodiment is the intermediate frequency (IF) signal from the tuner circuit 16. The A/D circuit 40 converts the IF signal to a digital IF signal as a function of the frequency of the IF signal and provides the digital IF signal to the digital down converter circuit 42.

The digital down converter circuit 42 is also within the common path and may be any circuit configuration capable of processing to generating a common path signal. An exemplary digital down converter circuit 42 includes a mixer and a decimation filter. In one embodiment, translating a center frequency of the digital IF signal to a new center frequency and filtering the translated signal generates the common path signal. In the presently preferred embodiment, the new center frequency is nominally 0 MHz. Accordingly, the translated IF signal is at baseband and is a baseband IF signal. Baseband IF signals are represented in complex form and are sampled with a sample rate greater than or equal to the two-sided bandwidth of the represented signal.

Translation of the center frequency of the digital IF signal to the new center frequency occurs by combination with a predetermined fixed frequency using, for example, a mixer. The predetermined fixed frequency may be generated by, for example, an oscillator circuit at a frequency similar to the nominal center frequency of the digital IF signal. In an exemplary embodiment, the nominal center frequency of the digital IF signal is 10.7 MHz and the predetermined fixed frequency is 10.7 MHz.

In addition to translating the center frequency, the digital down converter circuit 42 also filters the digital IF signal. Filtering reduces the bandwidth thus allowing reduction in the sample rate of the digital IF signal. The process of bandwidth and sample rate reduction is sometimes referred to as decimation and anti-alias filtering. The sample rate of the digital IF signal is reduced to a first sample rate conducive to processing by the digital modulation processing system 14. In addition, the digital IF signal is filtered to a bandwidth representative of the IBOC signal. In one embodiment, the digital IF signal is reduced to a bandwidth of 460 kHz; however, larger or smaller bandwidth reduction may be performed to optimize operation of the digital modulation processing system 14.

Figure 3:
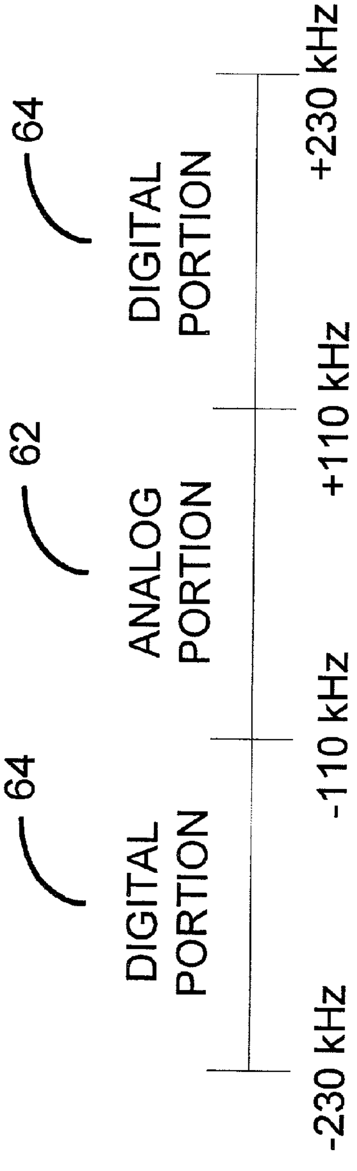
FIG. 3 illustrates one embodiment of a bandwidth allocation for an RF signal processed by the receiver system illustrated in FIG. 1.

FIG. 3 illustrates the spectrum allocation of one embodiment of the common path signal resulting from filtering and down converting the digital IF signal. The common path signal is allocated within a spectrum of 460 kHz and includes an analog portion 62 and a digital portion 64. In the illustrated embodiment, the analog portion 62 includes analog modulation content and the digital portion 64 includes digital modulation content. The bandwidth of the analog modulation content is in a range from about −110 kHz to +110 kHz. The digital modulation content resides in a bandwidth from −110 kHz to −230 kHz and also in a bandwidth from +110 kHz to +230 kHz. The bandwidth of the respective analog and digital portions 62, 64 of the IBOC signal is dependent on the transmitted RF signal and therefore may be different in different embodiments.

Referring again to FIG. 2, following translation and filtering within the common path, the digital down converter circuit 42 outputs the common path signal to a common path node 50. The common path node 50 may be electrically connected with the digital path line 28 as illustrated. The term "digital path" is used to identify the digital path line 28 as part of the digital modulation processing. The common path node 50 provides an interface with the digital modulation processing system 14 using the digital path line 28.

The common path signal and the digital path signal are the same signal. The reader should understand that the signal on the digital path line 28 is identified as the digital path signal to signify the departure from common processing. Where the RF signal 22 includes both the analog portion and the digital portion, the common path signal/digital path signal includes both portions. Alternatively, where the RF signal 22 includes either the analog portion or the digital portion the common path signal/digital path signal includes the same portion.

In one embodiment, the sample rate of the common path signal at the interface is optimum for processing with the digital modulation processing system 14. In another embodiment, the common path signal is subject to additional conversion to form the digital path signal. In this embodiment, the common path signal is converted to an optimal sample rate for processing with the digital modulation processing system 14. A sample rate conversion circuit operating in a well-known manner may perform the conversion of the common path signal to the digital path signal. In another embodiment, the conversion may be performed by phase locking the digital path signal to the output signal of the digital modulation processing system 14. The common path node 50 is also electrically connected with the decimation circuit 44 as illustrated in FIG. 2.

The decimation circuit 44 is part of the analog path and may be any circuit configuration capable of providing additional filtering of the common path signal. An exemplary embodiment of the decimation circuit 44 is a decimation filter. The decimation circuit 44 filters the common path signal to form an analog path signal. The term "analog path" refers to the signal path used to process the analog portion of IBOC signals. In addition, the term "analog path" denotes the portion of the processing circuit 18 performing some of the processing of conventional analog signals in non-IBOC signals.

Filtering to generate the analog path signal reduces the first sample rate to a second sample rate compatible with conventional processing of conventional analog signals. In one embodiment, the second sample rate of the analog path signal is approximately 350 kHz, and the bandwidth is reduced to approximately 220 kHz. In another embodiment, the decimation circuit 44 also includes filtering. In this embodiment, along with reduction of the bandwidth to 220 kHz, the decimation circuit 44 also removes any digital modulation present such that the analog path signal includes only the analog portion of the RF signal 22. The analog path signal is provided on an analog path line 52 to the channel filter circuit 46.

The channel filter circuit 46 is within the analog path and may be any circuit configuration capable of providing filtering that includes isolating the desired RF channel from adjacent channels. In the presently preferred embodiment, the channel filter circuit 46 in cooperative operation with the decimation circuit 44 removes the digital modulation such that the analog path signal contains only the analog portion of the RF signal 22. In this embodiment the channel filter circuit 46 also minimizes bleed over from adjacent channels to isolate the desired channel using well-known fixed filtering techniques. In another embodiment, the channel filter circuit 46 uses well-known variable filtering techniques. In yet another embodiment, filtering is performed, for example within the decimation circuit 44, and the channel filter circuit 46 is omitted. Following filtering, the channel filter circuit 46 provides the analog path signal to the demodulator circuit 48.

The demodulator circuit 48 is also within the analog path and may be any circuit configuration capable of demodulating the analog path signal. In the illustrated embodiment, the demodulator circuit 48 may be a conventional AM detector and/or an FM detector. For example, where the analog portion is a conventional FM signal, the demodulator circuit 48 generates the left and right audio channels. Following demodulation, the first audio signal generated by the demodulator circuit 48 on the first audio signal line 30 is provided to the signal control circuit 20.

The embodiment of the signal control circuit 20 illustrated in FIG. 2 includes a combiner circuit 54, an audio processing circuit 56 and a digital-to-analog converter (D/A) circuit 58 electrically connected as illustrated. The signal control circuit 20 is within the common path discussed with reference to FIG. 1. The combiner circuit 54 represents the resumption of further common processing following previously described independent processing within the analog path and the digital path.

The combiner circuit 54 provides an interface with the digital modulation processing system 14. The interface provides incorporation of the second audio signal into processing within the RF receiver 12 of the first audio signal. The second audio signal may be provided to the combiner circuit 54 at a compatible sample rate, or may be converted by sample rate conversion to a compatible sample rate.

The combiner circuit 54 may be any circuit configuration capable of selectively utilizing the first audio signal, the second audio signal or some combination thereof during generation of the audio output 24. The combiner circuit 54 generates a preliminary audio output on the preliminary audio output line 60 by combining the first and second audio signals. The preliminary audio output may be selectively combined as a function of operating parameters within the receiver system 10 to optimize fidelity of the audio output 24. Combining by the combiner circuit 54 may result in further processing with the first audio signal, the second audio signal, or some combination thereof.

In one embodiment, the combiner circuit 54 selectively combines the first and second audio signals as a function of signals from the digital modulation processing system 14. In this embodiment, the digital modulation processing system 14 compares the analog portion and the digital portion of the digital path signal to determine signal quality. In another embodiment, selection may be a function of analysis of the noise content of the analog portion and the digital portion provided by the RF receiver 12, the tuner 16 or some other analysis device. In yet another embodiment, the combination of the signal quality analysis by the digital modulation processing system 14 and the noise analysis by the RF receiver 12 and/or the tuner 16 is used. In still other embodiments, any other feed forward or feedback control technique and associated signals, analysis or measurement techniques may be used to direct the combiner circuit 54 to selectively utilize the analog portion and the digital portion.

The audio processing circuit 56 receives the preliminary audio output on the preliminary audio output line 60. The audio processing circuit 56 is within the common path and may be any circuit configuration that includes capability to manipulate audible parameters pertaining to the audio output 24. Exemplary audible parameters include volume, tone, balance, equalization, reverberation, concert hall effects or any other types of processing to adjust the sound imaging of the audio output 24. The audio processing circuit 56 processes and provides the preliminary audio output signal to the D/A circuit 58.

The D/A circuit 58 is also within the common path and may be any conventional digital-to-analog conversion circuit capable of converting a digital signal to an analog signal. The D/A circuit 58 converts the preliminary audio output signal to the audio output 24. For example, where the preliminary audio output signal is generated from an FM signal, the D/A circuit 58 generates two or more audio outputs 24 representing left and right channels.

During operation along the common path, the RF signal 22 for a predetermined channel frequency is isolated by the tuner circuit 16 and translated to an IF signal. The IF signal is sampled by the A/D circuit 40 to convert the signal from analog to digital. The digitized IF signal is filtered, and down converted to form the common path signal. The common path signal is made available to the digital modulation processing system 14 on the digital path line 28 and also provided to the decimation circuit 44.

During operation along the digital path, the digital modulation processing system 14 processes the digital path signal to generate the second audio signal on the second audio signal line 32. During operation along the analog path, the decimation circuit 44 reduces the first sample rate to the second sample rate. The second sample rate is conducive to processing conventional analog signals with the channel filter 46 and the demodulator circuit 48 to produce the first audio signal on the first audio line 30.

The combiner circuit 54 continues processing within the common path by selectively using at least one of the first and second audio signals to optimize the fidelity of the preliminary audio output. The audio processing circuit 56 and the D/A circuit 58 process the preliminary audio output within the common path to generate the audio output 24.

In another embodiment of the receiver system 10, the tuner circuit 16 includes a bandwidth switch control. The bandwidth switch control provides filtering that may be controlled as function of the content of the RF signal 22. The filtering may operatively cooperate with conventional channel frequency filtering of the tuner circuit 16 to provide frequency selectivity within a desired channel frequency. Frequency selectivity within the channel frequency may limit interference that may otherwise reduce the dynamic range of the A/D circuit 40.

Within this embodiment, the tuner circuit 16 may be directed to control the filtering with a bandwidth switch control signal. The bandwidth switch control signal may be provided by, for example, a micro controller external to the receiver system 10, the digital modulation processing system 14, the combiner circuit 54 or any other device involved in processing or analysis of the content of the RF signal 22.

Analysis of the content of the RF signal 22 may include, for example, determination of whether the RF signal 22 includes conventional analog signals or IBOC signals. As a function of this analysis, the filtering may be adjusted to accommodate a wider bandwidth signal, such as, for example, a 460 kHz signal (IBOC signal) or adjusted to accommodate a narrower signal, such as, for example, a 220 kHz signal (conventional analog signal). Other exemplary content analysis may include determination of the signal strength of adjacent channel frequencies, fidelity analysis, interference analysis or analysis of any other parameter that improves processing of the RF signal 22. Alternatively, the tuner circuit 16 may control the filtering as a function of analysis of the content of the RF signal 22 by the receiver system 10.

Figure 4:
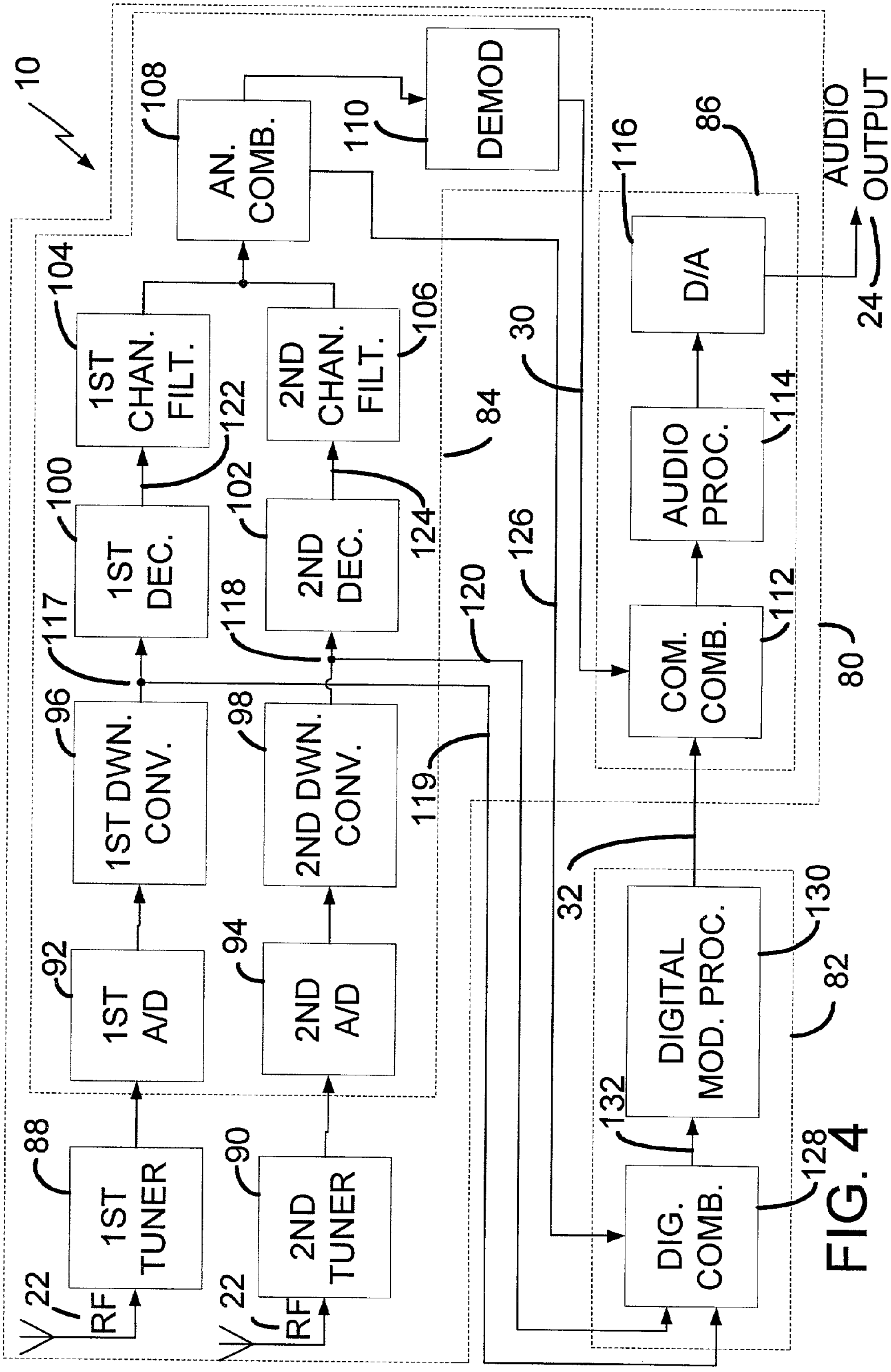
FIG. 4 is an expanded block diagram of another embodiment of the receiver system illustrated in FIG. 1.

FIG. 4 is a block diagram illustrating yet another embodiment of the receiver system 10. The receiver system 10 includes a radio frequency (RF) receiver 80 and a digital modulation processing system 82. The RF receiver 80 of the illustrated embodiment includes a processing circuit 84 and a signal control circuit 86. The processing circuit 84 includes first and second tuner circuits 88, 90, first and second A/D circuits 92, 94, first and second digital down converter circuits 96, 98, first and second decimation circuits 100, 102, first and second channel filters 104, 106, an analog path combiner circuit 108 and a demodulator circuit 110 electrically connected as illustrated. The signal control circuit 86 includes a common combiner circuit 112, an audio processing circuit 114 and a D/A circuit 116 also electrically connected as illustrated. The receiver system 10 is preferably used for processing RF broadcasts in the FM spectrum allocation, however, processing of RF broadcasts within other spectrums is possible.

The embodiment of the receiver system 10 illustrated in FIG. 4 is similar in many respects with the components and operation of the previously described embodiments of the receiver system 10. For example, processing by the RF receiver 80 occurs within the common path and the analog path, while processing by the digital modulation processing system 82 occurs within the digital path. In addition, the RF receiver 80 generates the first audio signal using circuitry and processing techniques within the common path and the analog path that are similar to circuitry and techniques for processing conventional analog modulation with the addition of interfaces to the digital modulation processing system 82.

For purposes of brevity, the following discussion will focus on differences between this embodiment and the previously discussed embodiments. As illustrated, this embodiment includes redundancy in receipt and processing paths of the RF signal 22. This form of redundancy is referred to as diversity. Diversity in the receiver system 10 provides duplicate processing to optimize fidelity and minimize interference. The duplicate processing is performed in a portion of the receiver system 10 that includes the common path, the analog path and the digital path. At the conclusion of the duplicate processing, evaluation to optimize performance occurs and one signal, or a combination of both signals, produced in the duplicate processing is used to produce one signal used in subsequent processing. The subsequent processing similarly includes the common path, the analog path and the digital path.

The RF signal 22 received by tuner circuits 88, 90 is translated to a first IF signal and a second IF signal, respectively in a conventional manner. The first and second IF signals are processed to generate respective first and second common path signals on first and second common path nodes 117, 118, respectively. The first common path signal is a first digital path signal on a first digital path line 119 and the second common path signal is a second digital path signal on a second digital path line 120. The first and second digital path lines 119, 120 are electrically coupled with the digital modulation processing system 82 within the digital path as will be hereinafter described. In addition to the first and second digital path lines 119, 120, the first and second common path signals are provided to the first and second decimation circuits 100, 102, respectively within the analog path.

The outputs of the first and second decimation circuits 100,102 are a first analog path signal and a second analog path signal, respectively. The first and second analog path signals are provided on a first analog path line 122 and a second analog path line 124, respectively to the first and second channel filters 104, 106. The output of the first and second channel filters 104, 106 are provided to the analog path combiner circuit 106. In another embodiment, the first and second channel filters 104, 106 may be a single channel filter following the analog path combiner circuit 108. In yet another embodiment, filtering is performed elsewhere and the first and second channel filters 104, 106 are omitted.

The analog path combiner circuit 108 may be any circuit configuration capable of selectively using the first and second analog path signals to create a single analog path signal. Selective use of the first and second analog path signals may be a function of feed forward control involving analysis of the signals prior to the analog path combiner circuit 108. Analysis may involve, for example, signal strength analysis, noise content or any other parameter to optimize the use of the first and second analog path signals. Alternatively, selective use of the first and second analog path signals may be a function of feedback control involving analysis of the resulting single analog path signal. This analysis may involve, for example, analysis of characteristics of the single analog path signal indicative of the level of optimization in combining the first and second analog path signals.

In one embodiment, the analog path combiner circuit 108 creates the single analog path signal with a technique sometimes referred to as beam steering. Beam steering is performed by multiplying each of the first and second analog path signals by a first and second complex coefficient, respectively. The complex coefficients are developed by the analog path combiner circuit 108 to adjust both the amplitude and phase of the first and second analog path signals.

Each of the first and second analog path signals is multiplied by a respective complex coefficient followed by addition of the resulting signals. Beam steering effectively creates an antenna pattern from the first and second analog path signals. The antenna pattern created favors pointing in a direction conducive to maximizing reception while minimizing reception from other directions. For example, where a strong interference is present in a certain direction, adjustment and addition of the first and second analog path signals effectively creates a null toward the direction of the strong interference. The null minimizes receipt of energy coming from that direction.

In another embodiment, the analog path combiner circuit 108 may selectively switch between the first and second analog path signals to generate the single analog path signal. Selective switching may be a function of at least one of signal quality, fidelity, noise content or any other parameter indicative of optimization of subsequent processing. The single analog path signal is then demodulated to form the first audio signal on the first audio line 30 electrically connected with the signal control circuit 86.

In still another embodiment, the analog path combiner circuit 108 generates a combiner signal. The combiner signal is indicative of the formation of the single analog path signal from the first and second analog path signals. For example, where beam steering is used to create the single analog path signal, the combiner signal is the first and second coefficients. Similarly, where either the first or second analog path signal is used, the combiner signal indicates which one. The combiner signal is generated on a combiner signal line 126 electrically connected with the digital modulation processing system 82.

The illustrated embodiment of the digital modulation processing system 82 includes a digital path combiner circuit 128 and a digital modulation processor 130 electrically connected as illustrated in FIG. 4. The digital path combiner circuit 128 may be any circuit configuration capable of selectively using the first and second digital path signals to generate a single digital path signal. The single digital path signal is generated on a combined digital path line 132. In one embodiment, the digital path combiner circuit 128 is electrically connected with the analog path combiner circuit 108 by the combiner signal line 126 as illustrated. In this embodiment, the digital path combiner circuit 128 selectively combines the first and second digital path signals as directed by the combiner signal.

In another embodiment, the digital path combiner circuit 128 uses the previously describe beam steering technique to generate the single digital path signal. In yet another embodiment, selection of at least one of the first and second digital path signals is a function of evaluation of the signals. Evaluation of the first and second digital path signals may be based on at least one of signal quality, fidelity, noise content or any other parameter indicative of optimization of subsequent processing.

The digital modulation processor 130 uses the resulting single digital path signal to generate the second audio signal. Operation of the digital modulation processor 130 is similar to the previously discussed embodiments of the digital modulation processing system 14 (FIG. 1). The digital modulation processor 130 isolates and demodulates the single digital path signal to produce the second audio signal on the second audio signal line 32. The second audio signal line 32 is electrically connected with the signal control circuit 86.

The signal control circuit 86 selectively uses the first and second audio signals individually or in some combination to generate the audio output 24 as in the previously described embodiments. In addition, the signal control circuit 86 controls parameters of the resulting sound waves through manipulation of the electric signal forming the audio output 24.

Figure 5:
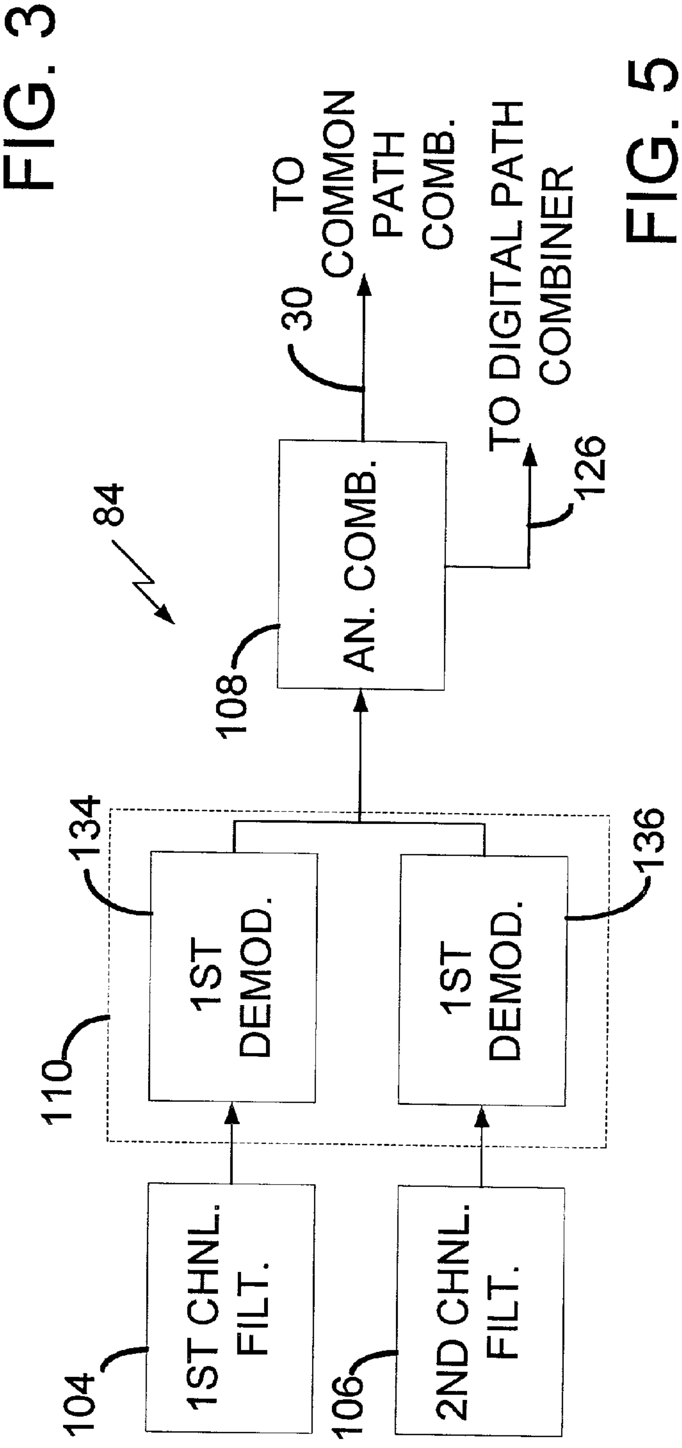
FIG. 5 is another embodiment of a portion of the expanded block diagram illustrated in FIG. 4.

FIG. 5 illustrates another embodiment of a portion of the processing circuit 84 illustrated in FIG. 4. The illustrated portion of the processing circuit 84 is along the analog path and includes first and second channel filters 104, 106, the analog path combiner circuit 108 and the demodulator circuit 110. In this embodiment, the demodulator circuit 110 is electrically connected between the first and second channel filters 104, 106 and the analog path combiner circuit 108. More specifically, the demodulator circuit 110 includes a first demodulator circuit 134 and a second demodulator circuit 136 electrically connected with the first channel filter 104 and the second channel filter 106, respectively, and the analog path combiner circuit 108. In addition, the analog path combiner circuit 108 is electrically connected with the common combiner circuit 112 (FIG. 4) by the first audio signal line 30.

In this embodiment, the first and second analog path signals are demodulated by the first and second demodulator circuits 134, 136 prior to the analog path combiner circuit 108. The demodulated first and second analog path signals are then blended by the analog path combiner circuit 108 to produce the first audio signal. In the presently preferred embodiment, during processing of RF broadcasts in the FM spectrum, the demodulated first and second analog path signals may be referred to as a first and a second multiplex (MPX) signal.

The analog path combiner circuit 108 uses the demodulated first and second analog path signals to generate a demodulated single analog path signal that is the first audio signal. The analog path combiner circuit 108 performs continuous blending of the amplitude of the demodulated first and second analog path signals. Blending may involve combining the demodulated first and second analog path signals, or using one or the other of the signals.

In one embodiment, blending may be performed through the use of a first and a second gain coefficient. The first and second gain coefficients are multiplied by the demodulated first and second analog path signals, respectively, to adjust the amplitude. Following amplitude adjustment, the demodulated first and second analog path signals are added to form the first audio signal. One significant difference between the embodiment illustrated in FIG. 5 and the embodiment illustrated in FIG. 4 is that the first and second analog path signals are demodulated and then blended in terms of amplitude in FIG. 5. Whereas in the embodiment illustrated in FIG. 4, blending is performed in terms of both amplitude and phase prior to demodulation.

In yet another embodiment, the analog path combiner circuit 108 may operate as a switch. Switching between the demodulated first and second analog path signals to generate the first audio signal may be a function of feed forward control or feedback control as previously described.

As in the previously discussed embodiments, one embodiment of the analog path combiner circuit 108 generates the combiner signal on the combiner signal line 126. The combiner signal may be the first and second gain coefficients or indication of which of the demodulated first and second analog path signals is switched. As in the embodiments previously described with reference to FIG. 4, the digital path combiner circuit 130 may operate independent of the combiner signal, or may be directed by the combiner signal. When directed by the combiner signal, the digital path combiner circuit 130 may operate with the first and second gain coefficients or the switch indication. In another embodiment, the digital path combiner circuit 130 operates as a switch based on the first and second gain coefficients. The digital path combiner circuit 130 switches based on whichever of the first and second gain coefficients is greater.

The previously described embodiments of the receiver system 10 provide a cost efficient architecture capable of processing conventional AM or FM signals and/or digital audio broadcast (DAB) signals. In the previously described architectures, processing of IBOC signals is performed with conventional circuits and techniques that include interfaces to the digital modulation processing system 14, 82. As such, the receiver system 10 minimizes redundancy of processing, cost of manufacture and complexity. In addition, the interfaces allow the digital modulation processing system 14, 82 to be fabricated as a fully digital device thereby providing additional minimization of size and complexity. Finally, the same RF receiver 12 may be used cost effectively in applications with or without the digital modulation processing system 14, 82 without additional design changes in the receiver system 10.

While the invention has been described above by reference to various embodiments, it will be understood that many changes and modifications can be made without departing from the scope of the invention. It is therefore intended that the foregoing detailed description be understood as an illustration of the presently preferred embodiments of the invention, and not as a definition of the invention. It is only the following claims, including all equivalents that are intended to define the scope of this invention.

What is claimed is:

1. A radio frequency receiver operable with a digital modulation processing system to process a radio frequency signal, the radio frequency signal including analog modulation and digital modulation, the radio frequency receiver comprising:

a digital down converter circuit operable to produce a common path signal comprising the analog modulation and the digital modulation;

a common path node coupled with the digital down converter circuit, wherein the common path signal is provided to the common path node as a digital signal at a first bandwidth and a first sample rate that are optimum for processing with the digital modulation processing system, wherein the common path node is configured to be selectively electrically coupled with the digital modulation processing system so that the common path signal is providable unfiltered to the digital modulation processing system to generate a second audio signal;

a decimation circuit electrically coupled with the common path node, the decimation circuit operable to reduce the first sample rate to a second sample rate and reduce the first bandwidth to a second bandwidth;

a demodulator circuit electrically coupled with the digital down converter circuit, the demodulator circuit operable to demodulate the analog portion of the common path signal to form a first audio signal;

a combiner circuit electrically coupled with the demodulator circuit with provision to receive the second audio signal, the combiner circuit operable to selectively utilize at least one of first audio signal and the second audio signal to produce a preliminary audio output; and an audio processing circuit and a digital-to-analog conversion circuit electrically coupled with the combiner circuit, the audio processing circuit and the digital-to-analog conversion circuit operable to produce an audio output from the preliminary audio output.

2. The radio frequency receiver of claim 1, wherein the common path signal is at a center frequency that is nominally about zero hertz.

3. The radio frequency receiver of claim 2, wherein the common path signal is at a bandwidth of about 460 kHz that is representative of the analog modulation and the digital modulation.

4. The radio frequency receiver of claim 1, further comprising a channel filter circuit electrically coupled with the decimation circuit and the demodulator circuit, the decimation circuit and the channel filter circuit cooperatively operable to process the common path signal to remove the digital modulation and produce an analog path signal, the analog path signal processed by the demodulator circuit to produce the first audio signal.

5. The radio frequency receiver of claim 1, further comprising a tuner circuit and an analog-to-digital conversion circuit electrically coupled with the digital down converter circuit, the tuner circuit and the analog-to-digital conversion circuit in operable cooperation to process the radio frequency signal to produce a digitized intermediate frequency signal, the digitized intermediate frequency signal processed by the digital down converter circuit to produce the common path signal.

6. A radio frequency receiver operable with a digital modulation processing system to receive and process a radio frequency signal, the radio frequency receiver comprising:

a processing circuit operable to produce a digital path signal with the radio frequency signal, wherein the radio frequency signal includes an analog portion and a digital portion, the digital path signal is a common path signal with a first bandwidth of about 460 kHz that includes the analog portion in a bandwidth range of about −110 kHz to about +110 kHz and the digital portion in a bandwidth range of about +110 kHz to about +230 kHz and about −110 kHz to about −230 kHz, wherein the common path signal is optimized to be directly useable by the digital modulation processing system to generate a second audio signal, wherein the processing circuit is operable to reduce the first bandwidth of the common path signal to a second bandwidth of about 220 kHz to produce a first audio signal; and a signal control circuit electrically coupled with the processing circuit with provision to receive the second audio signal, the signal control circuit operable to selectively process at least one of the first audio signal and the second audio signal to produce an audio output, wherein the signal control circuit comprises a combiner circuit, an audio processing circuit and a digital-to-analog conversion circuit.

7. The radio frequency receiver of claim 6, wherein the processing circuit comprises an analog-to-digital conversion circuit, a digital down converter circuit and a decimation circuit.

8. The radio frequency receiver of claim 7, wherein the analog-to-digital conversion circuit and the digital down converter circuit are cooperatively operable to generate the digital path signal.

9. The radio frequency receiver of claim 7, wherein the decimation circuit is operable to produce an analog path signal with the digital path signal, the first audio signal produced from the analog path signal.

10. The radio frequency receiver of claim 6, further comprising a tuner circuit electrically coupled with the processing circuit, the tuner circuit operable to produce an intermediate frequency signal from the radio frequency signal, the intermediate frequency signal processed by the processing circuit to generate the digital path signal and the first audio signal.

11. The radio frequency receiver of claim 6, wherein the combiner circuit is operable to selectively utilize the first audio signal and the second audio signal to produce a preliminary audio output, the preliminary audio output used to produce the audio output.

12. A receiver system for processing a radio frequency signal that includes at least one of an analog portion and a digital portion, the receiver system comprising:

a processing circuit operable to generate a digital path signal comprising at least one of the analog portion and the digital portion of the radio frequency signal, the processing circuit operable to generate a first audio signal when the analog portion is present, wherein the processing circuit comprises a decimation circuit and an analog path combiner circuit, wherein the decimation circuit is operable to generate an analog path signal from the digital path signal, the analog path signal comprising the analog portion absent the digital portion, and wherein the analog path combiner circuit is electrically coupled with the decimation circuit, wherein the analog path signal comprises a first analog path signal and a second analog path signal selectively utilized by the analog path combiner circuit to produce a single analog path signal; and a digital modulation processing system electrically coupled with the processing circuit, the digital modulation processing system operable to generate a second audio signal from the digital path signal when the digital portion is present.

13. The receiver system of claim 12, wherein the processing circuit further comprises a channel filter circuit and a demodulator circuit electrically coupled with the decimation circuit, the channel filter circuit and the demodulator circuit cooperatively operable to process the analog path signal to generate the first audio signal.

14. The receiver system of claim 12, further comprising a sample rate conversion circuit electrically coupled with the processing circuit and the digital modulation processing system, the sample rate conversion circuit operable to convert a sample rate of the digital path signal to an optimum sample rate for the digital modulation processing system.

15. The receiver system of claim 12, wherein the digital modulation processing system comprises a digital path combiner circuit electrically coupled with a digital modulation processor.

16. The receiver system of claim 12, wherein the digital modulation processing system comprises a digital path combiner circuit and the digital path signal comprises a first digital path signal and a second digital path signal selectively utilized by the digital path combiner circuit to form a single digital path signal.

17. The receiver system of claim 16, wherein the digital modulation processing system further comprises a digital modulation processor operable to generate the second audio signal as a function of the single digital path signal.

18. The receiver system of claim 12, further comprising a signal control circuit electrically coupled with the processing circuit and the digital modulation processing system, the signal control circuit operable to selectively utilize at least one of the first audio signal and the second audio signal to produce an audio output.

19. The receiver system of claim 18, wherein the signal control circuit comprises a combiner circuit and an audio processing circuit, the combiner circuit operable to selectively utilize the first audio signal and the second audio signal to produce a preliminary audio output.

20. A receiver system for processing a radio frequency signal, the receiver system comprising:

a digital down converter circuit operable to generate a digital path signal from the radio frequency signal;

a decimation circuit electrically coupled with the digital down converter circuit, the decimation circuit operable to generate an analog path signal from the digital path signal;

a demodulation circuit electrically coupled with the decimation circuit, the demodulation circuit operable to demodulate the analog path signal to produce a first audio signal;

a digital modulation processing system electrically coupled with the digital down converter circuit, the digital modulation processing system operable to process the digital path signal to produce a second audio signal;

a combiner circuit electrically coupled with the digital modulation processing system and the demodulation circuit, the combiner circuit operable to selectively utilize at least one of the first audio signal and the second audio signal to produce a preliminary audio output; and an analog path combiner circuit electrically coupled with the demodulation circuit and the digital modulation processing system, wherein a demodulated analog path signal comprises a first demodulated analog path signal and a second demodulated analog path signal selectively combinable by the analog path combiner circuit to produce the first audio signal.

21. The receiver system of claim 20, wherein the digital path signal is a digital signal generated at an optimal sample rate for processing with the decimation circuit and the demodulation circuit.

22. The receiver system of claim 20, wherein the radio frequency signal and the digital path signal comprise an analog portion and a digital portion.

23. The receiver system of claim 22, wherein the analog path signal comprises the analog portion absent the digital portion.

24. The receiver system of claim 20, wherein the analog path signal has a bandwidth of about 220 kHz.

25. The receiver system of claim 20, wherein the digital path signal has a bandwidth of about 460 kHz.

26. The receiver system of claim 20, further comprising an analog path combiner circuit electrically coupled with the decimation circuit and the demodulation circuit, wherein the analog path signal provided from the decimation circuit to the analog path combiner circuit comprises a first analog path signal and a second analog path signal selectively combinable by the analog path combiner circuit prior to demodulation by the demodulation circuit.

27. The receiver system of claim 26, wherein the analog path combiner circuit is operable to selectively combine the first analog path signal and the second analog path signal with beam steering.

28. The receiver system of claim 26, wherein the digital modulation processing system comprises a digital path combiner circuit electrically connected with a digital modulation processor and the analog path combiner circuit, wherein the digital path signal comprises a first digital path signal and a second digital path signal selectively combinable by the digital path combiner circuit to form a single digital path signal as a function of a combiner signal provided by the analog path combiner circuit, the digital modulation processor operable to generate the second audio signal as a function of the single digital path signal.

29. The receiver system of claim 26, wherein the digital modulation processing system comprises a digital path combiner circuit electrically coupled with a digital modulation processor and the analog path combiner circuit, wherein the digital path signal comprises a first digital path signal and a second digital path signal selectively combinable by the digital path combiner circuit to form a single digital path signal as a function of a combiner signal provided by the analog path combiner circuit, the digital modulation processor operable to generate the second audio signal as a function of the single digital path signal.

30. The receiver system of claim 20, wherein the radio frequency signal is an in band on channel signal.

31. A method of processing a broadcast signal, the method comprising:

receiving a radio frequency signal;

translating the radio frequency signal to produce an intermediate frequency signal;

down converting the intermediate frequency signal;

filtering the intermediate frequency signal to produce a digital path signal;

filtering the digital path signal to produce an analog path signal;

processing the analog path signal, wherein the analog path signal comprises a first analog path signal and a second analog path signal;

selectively combining the first analog path signal and the second analog path signal to generate a first audio signal;

processing the digital path signal to generate a second audio signal; and selecting at least one of the first audio signal and the second audio signal to produce an audio output.

32. The method of claim 31, wherein processing the analog path signal comprises:

filtering the analog path signal; and demodulating the analog path signal.

33. The method of claim 31, wherein processing the digital path signal comprises:

isolating a digital portion of the digital path signal; and demodulating the digital portion.

34. The method of claim 33, wherein processing the digital path signal further comprises the initial act of converting a sample rate of the digital path signal to a sample rate conducive to processing with a digital modulation processing system.

35. The method of claim 31, wherein selecting at least one of the first audio signal and the second audio signal comprises:

selectively combining the first audio signal and the second audio signal to form a preliminary audio output;

audio processing the preliminary audio output; and converting the preliminary audio output to an analog output to form the audio output.

36. The method of claim 31, wherein selectively combining the first analog path signal and the second analog path signal comprises:

selectively combining the first analog path signal and the second analog path signal to form a single analog path signal; and demodulating the single analog path signal.

37. The method of claim 31, wherein selectively combining the first analog path signal and the second analog path signal comprises:

demodulating the first analog path signal and the second analog path signal; and selectively blending the demodulated first analog path signal and the demodulated second analog path signal.

38. The method of claim 31, wherein the digital path signal comprises a first digital path signal and a second digital path signal and processing the digital path signal comprises:

selectively combining the first digital path signal and the second digital path signal to form a single digital path signal;

isolating a digital portion of the single digital path signal; and demodulating the digital portion.

39. The method of claim 31, wherein the digital path signal comprises a first digital path signal and a second digital path signal and processing the digital path signal comprises:

selectively combining the first digital path signal and the second digital path signal as a function of the combination of the first analog path signal and the second analog path signal to form a single digital path signal;

isolating a digital portion of the single digital path signal; and demodulating the digital portion.

40. The method of claim 37, wherein the digital path signal comprises a first digital path signal and a second digital path signal and selecting at least one of the first audio signal and the second audio signal comprises:

selectively combining the first digital path signal and the second digital path signal as a function of the blending of the demodulated first analog path signal and the demodulated second analog path signal to form a single digital path signal;

isolating a digital portion of the single digital path signal; and demodulating the digital portion.

41. The method of claim 31, wherein the method is performed by a radio frequency receiver.

42. The method of claim 31, wherein processing the digital path signal is performed by a digital modulation processing system.

43. The receiver system of claim 12, wherein the analog path combiner circuit is configured to selectively utilize the first and second analog path signals as a function of evaluation of the first and second analog path signals.

44. The receiver system of claim 16, wherein the digital path combiner circuit is configured to selectively utilize the first and second digital path signals as directed by the analog path combiner circuit.

45. A receiver system for processing a radio frequency signal that includes at least one of an analog portion and a digital portion, the receiver system comprising:

a processing circuit operable to generate a digital path signal comprising at least one of the analog portion and the digital portion of the radio frequency signal, the processing circuit operable to generate a first audio signal when the analog portion is present; and a digital modulation processing system electrically coupled with the processing circuit, the digital modulation processing system operable to generate a second audio signal from the digital path signal when the digital portion is present, wherein the digital modulation processing system comprises a digital path combiner circuit and the digital path signal comprises a first digital path signal and a second digital path signal, wherein the digital path combiner circuit is directed by a signal from the processing circuit to form a single digital path signal from the first arid second digital path signals.

46. The receiver system of claim 45, wherein the processing circuit comprises a decimation circuit operable to generate an analog path signal from the digital path signal, the analog path signal comprising the analog portion absent the digital portion.

47. The receiver system of claim 46, wherein the processing circuit further comprises a channel filter circuit and a demodulator circuit electrically coupled with the decimation circuit, the channel filter circuit and the demodulator circuit cooperatively operable to process the analog path signal to generate the first audio signal.

48. The receiver system of claim 46, further comprising an analog path combiner circuit electrically coupled with the decimation circuit, wherein the analog path signal comprises a first analog path signal and a second analog path signal selectively utilized by the analog path combiner circuit to produce a single analog path signal.

49. The receiver system of claim 45, further comprising a sample rate conversion circuit electrically coupled with the processing circuit and the digital modulation processing system, the sample rate conversion circuit operable to convert a sample rate of the digital path signal to an optimum sample rate for the digital modulation processing system.

50. The receiver system of claim 45, wherein the digital modulation processing system further comprises a digital modulation processor operable to generate the second audio signal as a function of the single digital path signal.

51. The receiver system of claim 45, further comprising a signal coupled with the processing circuit and the digital modulation processing system, the signal control circuit operable to selectively utilize at least one of the first audio signal and the second audio signal to produce an audio output.

52. The receiver system of claim 51, wherein the signal control circuit comprises a combiner circuit and an audio processing circuit, the combiner circuit operable to selectively utilize the first audio signal and the second audio signal to produce a preliminary audio output.

53. The receiver system of claim 48, wherein the analog path combiner circuit is configured to generate the signal to direct the digital path combiner circuit to form the single digital path signal from the first and second digital path signals.

54. A receiver system for processing a radio frequency signal, the receiver system comprising:

a digital down converter circuit operable to generate a digital path signal from the radio frequency signal;

a decimation circuit electrically coupled with the digital down converter circuit, the decimation circuit operable to generate an analog path signal from the digital path signal;

a demodulation circuit electrically coupled with the decimation circuit, the demodulation circuit operable to demodulate the analog path signal to produce a first audio signal;

a digital modulation processing system electrically coupled with the digital down converter circuit, the digital modulation processing system operable to process the digital path signal to produce a second audio signal;

a combiner circuit electrically coupled with the digital modulation processing system and the demodulation circuit, the combiner circuit operable to selectively utilize at least one of the first audio signal and the second audio signal to produce a preliminary audio output; and an analog path combiner circuit electrically coupled with the decimation circuit and the demodulation circuit, wherein the analog path signal provided from the decimation circuit to the analog path combiner circuit comprises a first analog path signal and a second analog path signal selectively combinable by the analog path combiner circuit prior to demodulation by the demodulation circuit.

55. The receiver system of claim 54, wherein the analog path combiner circuit is operable to selectively combine the first analog path signal and the second analog path signal with beam steering.

56. The receiver system of claim 54, wherein the digital modulation processing system comprises a digital path combiner circuit electrically connected with a digital modulation processor and the analog path combiner circuit, wherein the digital path signal comprises a first digital path signal and a second digital path signal selectively combinable by the digital path combiner circuit to form a single digital path signal as a function of a combiner signal provided by the analog path combiner circuit, the digital modulation processor operable to generate the second audio signal as a function of the single digital path signal.

57. The radio frequency receiver of claim 3, wherein the analog modulation occupies a portion of the bandwidth in a range from about −110 kHz to about +110 kHz and the digital modulation occupies a portion of the bandwidth from about −230 kHz to about 110 kHz and from about +110 kHz to about +230 kHz.

* * * * *

UNITED STATES PATENT AND TRADEMARK OFFICE

CERTIFICATE OF CORRECTION

PATENT NO. : 7,106,809 B2
APPLICATION NO. : 09/862043
DATED : September 12, 2006
INVENTOR(S) : J. William Whikehart et al.

It is certified that error appears in the above-identified patent and that said Letters Patent is hereby corrected as shown below:

Column 18
Line 59, delete "arid" and insert --and--.

Column 19
Line 21, after "signal" and before "coupled" insert --control circuit electrically--.

Signed and Sealed this

Nineteenth Day of December, 2006

JON W. DUDAS
*Director of the United States Patent and Trademark Office*